United States Patent
Essawy et al.

(10) Patent No.: US 11,982,721 B2
(45) Date of Patent: May 14, 2024

(54) DETECTING LEAKAGE CURRENTS IN A POWERED ELECTRICAL SYSTEM

(71) Applicant: Rosemount Aerospace Inc., Burnsville, MN (US)

(72) Inventors: Magdi A. Essawy, Lakeville, MN (US); Dennis A. Quy, Apple Valley, MN (US)

(73) Assignee: Rosemount Aerospace Inc., Burnsville, MN (US)

( * ) Notice: Subject to any disclaimer, the term of this patent is extended or adjusted under 35 U.S.C. 154(b) by 710 days.

(21) Appl. No.: 17/144,934

(22) Filed: Jan. 8, 2021

(65) Prior Publication Data

US 2022/0221525 A1   Jul. 14, 2022

(51) Int. Cl.
  *G01R 31/52*   (2020.01)
  *B64D 15/12*   (2006.01)
  *G01R 31/58*   (2020.01)
  *H05B 3/02*    (2006.01)

(52) U.S. Cl.
  CPC ............. *G01R 31/52* (2020.01); *B64D 15/12* (2013.01); *G01R 31/58* (2020.01); *H05B 3/02* (2013.01)

(58) Field of Classification Search
  CPC ...... G01R 31/52; G01R 31/58; G01R 31/008; B64D 15/12; H05B 3/02
  USPC .......................................................... 361/50
  See application file for complete search history.

(56) References Cited

U.S. PATENT DOCUMENTS

| 4,335,348 | A | | 6/1982 | Reed et al. |
| 4,348,708 | A | * | 9/1982 | Howell .................... H02H 3/33 |
| | | | | 361/45 |
| 10,151,785 | B2 | | 12/2018 | Essawy et al. |
| 10,180,449 | B2 | | 1/2019 | Essawy et al. |

(Continued)

FOREIGN PATENT DOCUMENTS

| DE | 3824913 A1 * | 2/1990 |
| EP | 2249169 A1 | 11/2010 |

(Continued)

OTHER PUBLICATIONS

Extended European Search Report dated Jun. 2, 2022, for corresponding European Application No. 22150027.5.

*Primary Examiner* — Huy Q Phan
*Assistant Examiner* — Haidong Zhang
(74) *Attorney, Agent, or Firm* — Kinney & Lange, P.A.

(57) ABSTRACT

Apparatus and associated methods relate to detecting leakage current in a powered electrical system. Leakage current is detected by comparing a high-frequency response signal with a high-frequency reference signal. A high-frequency excitation signal is coupled, via an inducer, into the powered electrical system at a first location. The high-frequency response signal is sensed, via a signal sensor, at a second location of the powered electrical system. Because the electrical dynamics of the powered electrical system can change in response to system degradation that results in leakage current, changes in the high-frequency response signal can be indicative of leakage. Thus, the high-frequency response signal is compared, by a controller, with a high-frequency reference signal. The high-frequency reference signal can be a high-frequency response signal obtained at a reference time, at which the powered electrical system is operating without leakage.

19 Claims, 3 Drawing Sheets

(56) References Cited

U.S. PATENT DOCUMENTS

| | | |
|---|---|---|
| 10,197,517 B2 | 2/2019 | Essawy et al. |
| 10,564,203 B2 | 2/2020 | Essawy et al. |
| 2010/0309592 A1* | 12/2010 | Kinsel ................... H02H 3/331 361/50 |
| 2012/0146655 A1* | 6/2012 | Suchoff ................ G01R 19/165 324/509 |
| 2012/0194200 A1 | 8/2012 | McDiarmid et al. |
| 2013/0057988 A1* | 3/2013 | Ward ....................... H02H 3/33 361/42 |
| 2017/0259927 A1* | 9/2017 | Schram ................... H02H 3/20 |
| 2018/0275183 A1 | 9/2018 | Essawy et al. |
| 2018/0275185 A1 | 9/2018 | Essawy et al. |
| 2019/0331724 A1* | 10/2019 | Ikushima ............. G01R 15/185 |
| 2019/0382139 A1 | 12/2019 | Shi |
| 2020/0191850 A1 | 6/2020 | Essawy et al. |
| 2020/0191851 A1 | 6/2020 | Essawy et al. |

FOREIGN PATENT DOCUMENTS

| | | | |
|---|---|---|---|
| KR | 20170019751 A | * | 2/2017 |
| WO | 2011144649 A1 | | 11/2011 |
| WO | 2012010193 A1 | | 1/2012 |

* cited by examiner

DETECTING LEAKAGE CURRENTS IN A POWERED ELECTRICAL SYSTEM

BACKGROUND

Powered electrical systems are ubiquitous in our technological society. They can be found in homes, businesses, vehicles, and spacecrafts. Some powered electrical systems operate in environments that are quite severe, such as very high or very low temperatures, high pressures, corrosive chemicals or particles, etc. Furthermore, failure of some powered electrical systems can present dangers to persons or property. For example, aircrafts have many powered electrical systems that are operated so as to maintain safe flight operations. Numerous sensors provide metrics used by pilots and/or various systems, which respond to such metrics so as to properly control the aircraft. Air data sensors, for example provide metrics of altitude, airspeed, angle-of-attack, etc., all of which are used by pilots and other systems to maintain safe operation of the aircraft. Some air data sensors have resistive heating elements to prevent icing during operation within cloud atmospheres where icing conditions are present. Should such resistive heating elements fail, the metrics obtained by the associated sensor might no longer be usable. Identification of resistive heating element degradation before failure of the resistive heating element is therefore desirable.

SUMMARY

Apparatus and associated methods relate to a system for measuring leakage current. The system includes first and second transformers, an inducer, a signal sensor and a controller. The first transformer has a primary winding about a first magnetic core having a first passageway configured to provide passage therethrough for an electrical cable. The second transformer has a secondary winding about a second magnetic core having a second passageway configured to provide passage therethrough for the electrical cable. The electrical cable operates as a secondary winding for the first transformer and a primary winding for the second transformer when passing through both the first and second passageways. The inducer conductively couples to the primary winding of the first transformer. The inducer generates a high-frequency excitation signal into the primary winding of the first transformer. The signal sensor is conductively coupled to the secondary winding of the second transformer. The signal sensor senses the high-frequency response signal induced, in response to the high-frequency excitation signal, into the secondary winding of the second transformer. The controller performs a signal comparison of a high-frequency reference signal and the high-frequency response signal sensed by the signal sensor. The controller generates a signal indicative of leakage based on the signal comparison.

Some embodiments relate to a method for measuring leakage current. The method includes coupling, via a first transformer having a primary winding about a first magnetic core having a first passageway configured to provide passage therethrough for an electrical cable, the electrical cable with the secondary winding of the electrical transformer. The method include coupling, via a second transformer having a secondary winding about a second magnetic core having a second passageway configured to provide passage therethrough for the electrical cable, the primary winding of the second transformer and the electrical cable. The method includes generating, via an inducer conductively coupled to the primary winding of the first transformer, a high-frequency excitation signal into the primary winding of the first transformer. The method includes sensing, via a sensor conductively coupled to the secondary winding of the second transformer, a high-frequency response signal induced into the secondary winding of the second transformer. The method includes performing, via a controller, a signal comparison of a high-frequency reference signal and the high-frequency response signal sensed by the sensor. The method also includes generating, via the controller, a signal indicative of leakage based on the signal comparison.

DETAILED DESCRIPTION

Apparatus and associated methods relate to detecting leakage current in a powered electrical system. Such leakage current can be detected by changes in a high-frequency response signal within an electrical power cable that provides operating power to the powered electrical system. A high-frequency excitation signal is induced into the electrical power cable at a first location along the electrical power cable, and a high-frequency response signal is sampled at a second location along the electrical power cable. The electrical power cable includes a plurality of conductive wires for providing a closed-circuit path for operating current to and from the powered electrical system. The high-frequency response signal can be compared with a high-frequency reference signal to determine whether changes in the high-frequency response signal (e.g., changes indicative of leakage) have occurred. The high-frequency reference signal can be a high-frequency response signal obtained at an earlier time. For example, the high-frequency reference signal can be obtained at a time of calibration, at a time of initial operation of the powered electrical system, or at any time of system operation with no leakage current (i.e., a time of proper functioning of the powered electrical system).

The high-frequency response signal can change over time in response to changes in the powered electrical system. Should the powered electrical system become degraded in some fashions, leakage paths can develop. For example, electrical insulators can degrade causing changes to impedances between components of the powered electrical system and a grounded nearby chassis. Such impedance changes can then present differences in the electrical dynamics of the powered electrical system as such electrical dynamics relate to an induced high-frequency excitation signal.

Figure 1:
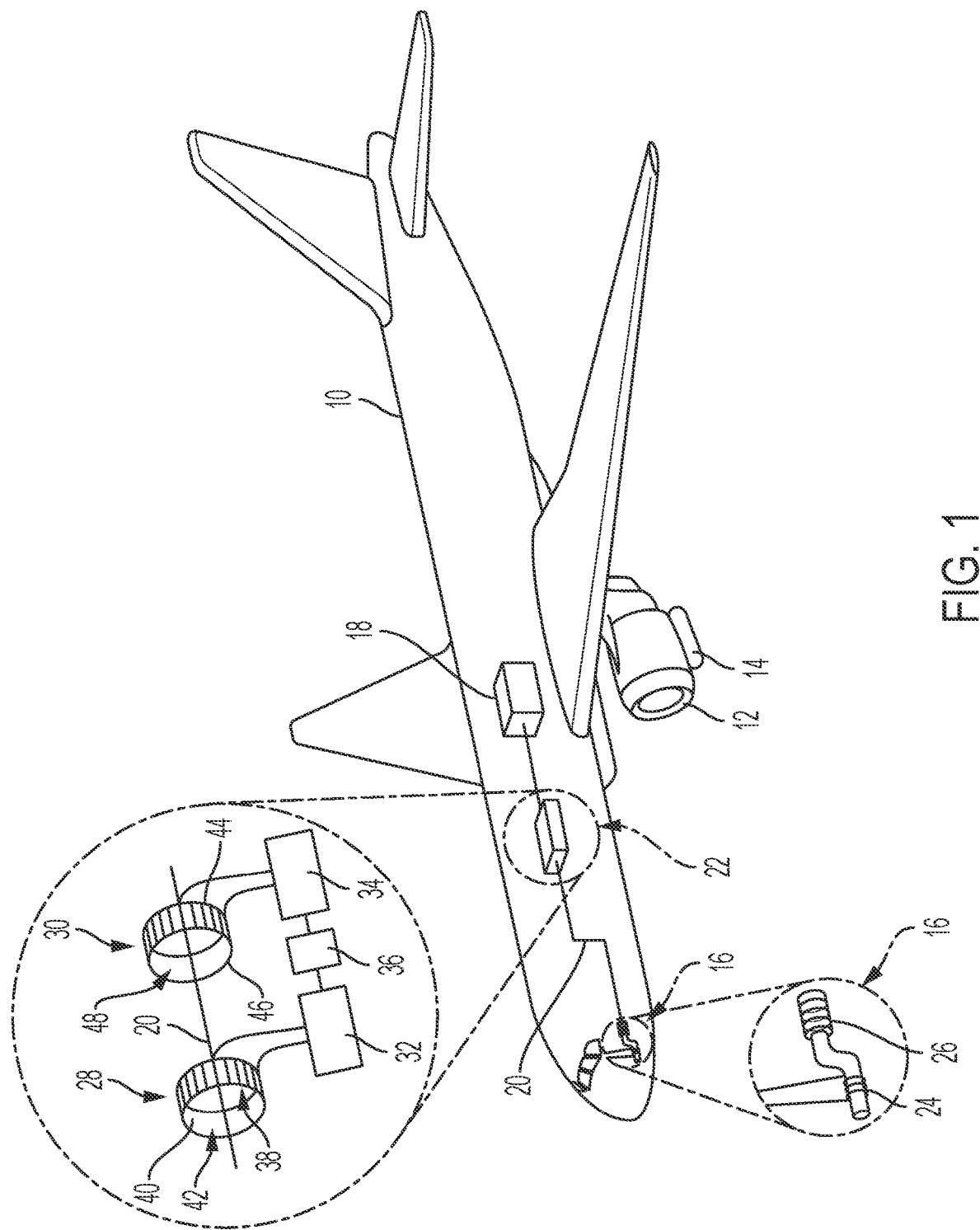
FIG. 1 is a schematic diagram of an aircraft equipped with a system for measuring leakage current of a sensor resistive heating element.

FIG. 1 is a schematic diagram of an aircraft equipped with a system for measuring leakage current of a sensor resistive heating element. In FIG. 1, aircraft 10 includes engine 12, which drives electrical generator 14 so as to provide electrical operating power to various powered electrical systems aboard aircraft 10. Aircraft 10 is also equipped with various sensors, including sensor 16. Sensor 16 is an electrical system powered by power source 18, which is configured to convert power provided by electrical generator 14 to that power specifically required by sensor 16. Sensor 16 received operating power from power source 18 via electrical power cable 20. Aircraft 10 is also equipped with leakage-current detector 22, which is configured to detect leakage current of a powered electrical system. In the depicted embodiment, leakage-current detector is configured to detect leakage current of sensor 16.

Although leakage-current detector 22 can be used to detect leakage current in a variety of powered electrical systems, in the depicted embodiment, sensor 16 senses air pressure. Various air data sensors sense air pressure for the purpose of determining various air data metrics, such airspeed, altitude sensor, angle-of-attach, etc. In the depicted embodiment, sensor 16 is a Pitot tube airspeed detector that includes resistive heating element 24, and ram pressure sensor 26. Resistive heating element 24 is configured to prevent icing of sensor 16 when aircraft 10 is operating in an atmosphere in which ice accretion can occur.

Leakage-current detector 22 has first transformer 28, second transformer 30, inducer 32, signal sensor 34, and controller 36. First transformer 28 has primary winding 38 about first magnetic core 40 having first passageway 42 through which electrical power cable 20 passes. By passing through first passageway 42, electrical power cable 20 functions as a secondary winding of first transformer 28. Second transformer 30 has secondary winding 44 about second magnetic core 46 having second passageway 48 through which electrical power cable 20 passes. By passing through second passageway 48, electrical power cable 20 functions as a primary winding of second transformer 30. Inducer 32 is conductively coupled to primary winding 38 of first transformer 28. Inducer 32 generates a high-frequency excitation signal into primary winding 38 of first transformer 28. Signal sensor 34 is conductively coupled to secondary winding 44 of second transformer 30. Signal sensor 34 senses a high-frequency response signal induced, in response to the high-frequency excitation signal, into secondary winding 44 of second transformer 30. Controller 36 performs a signal comparison of a high-frequency reference signal and the high-frequency response signal sensed by signal sensor 34. Controller 36 generates a signal indicative of leakage current based on the signal comparison.

Figure 2:
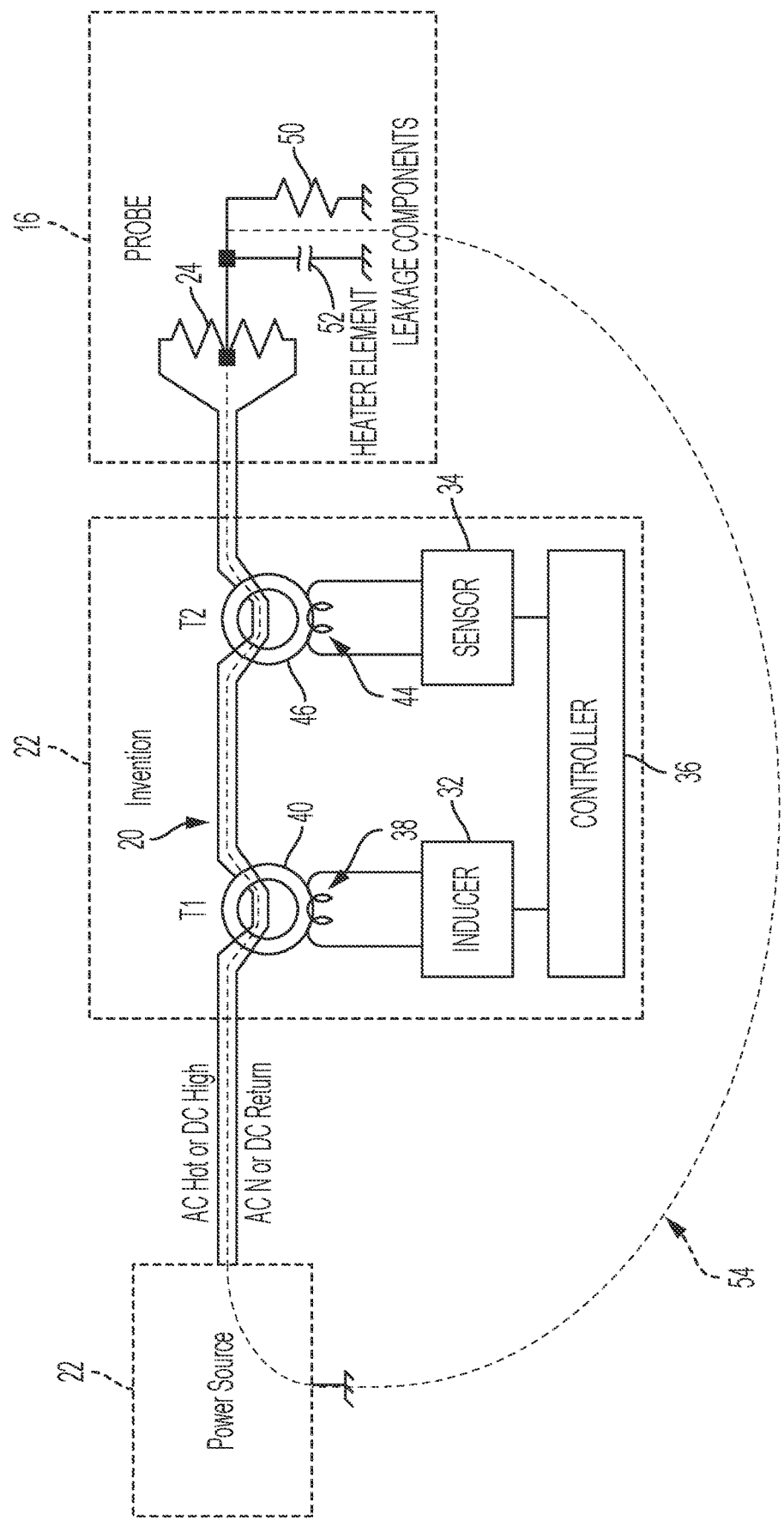
FIG. 2 is a schematic diagram of system for measuring leakage current for a powered electrical system.

FIG. 2 is a schematic diagram of system for measuring leakage current for a powered electrical system. In FIG. 2, sensor 16 and leakage-current detector 22 of FIG. 1 are depicted in more schematic detail. Sensor 16 includes resistive heating element 24 and impedance components 50 and 52, which correspond to a leakage condition of resistive heating element 24. For example, resistive heating element 24 can be electrically isolated from a nearby grounded chassis by an insulative member. When such insulative member degrades, the impedance parameters at the location of such degradation can change. Such impedance parameters can include capacitance and/or resistive components, as represented by resistor 50 and/or capacitor 52. As such impedance changes, as represented by changes in resistor 50 and/or capacitor 52, the electrical dynamics change for a powered electrical system, which in the depicted embodiment includes power source 18 electrical power cable 20, heating resistive heating element 24, resistor 50 and capacitor 52.

When resistor 50 and/or capacitor 52 is present, leakage path 54 for the powered electrical system is created. Normally, when no leakage path is present, a sum of currents in the conductors of electrical power cable 20 is zero. Such a sum (i.e., zero) indicates that any positive current provided by one or more conductors is matched by return current carried by other conductors. Leakage path 54 provides a return path of current that is conducted by various conductive members not part of the powered electrical system. Such members can include metal chassis, metal airframes, other conductive structural elements, etc. Changes in resistance and/or capacitance of resistor 50 and/or capacitor 52, respectively, also change the electrical dynamics of the powered electrical system, which affects the high-frequency response signal generated for leakage-current-detection purposes by leakage-current detector 22.

As described above with reference to FIG. 1, leakage-current detector 22 induces (via primary winding 38 of first transformer 28) a high-frequency excitation signal into the conductors (operating as a secondary winding of first transformer 28) of electrical power cable 20 at a first location where first transformer 28 is located. Such induction of the high-frequency excitation signal is a function of the impedance of the powered electrical system as seen from the secondary winding (i.e., the location along electrical power cable where it passes through first magnetic core 40 of first transformer 28) of first transformer 28. Such impedance changes with changing resistance and/or capacitance of resistor 50 and/or capacitor 52, respectively. For example, a normally high impedance can be significantly reduced with increasing values of capacitance of capacitor 54 and/or decreasing values of resistance of resistor 52.

The high-frequency excitation signal induced into electrical power cable 20 at the first location is then communicated (e.g., conductively and/or inductively as well as by reflection at a terminating locations, such as at a location or power source 18 and at location of resistor 50 and capacitor 52) along electrical power cable 20 to a second location where electrical power cable 20 passes through second magnetic core 46 of second transformer 30. There, at the second location, a high-frequency response signal is generated by such conduction and reflection. This high-frequency response signal is then coupled by electrical power cable (operating as a primary winding of second transformer 30) to signal sensor 34 coupled to secondary winding 44 via second transformer 30. The high-frequency response signal is then sensed by signal sensor 34 and communicated to controller 36, which compares the sensed high-frequency response signal to a high-frequency reference signal. Various metrics of comparison can be used. For example, steady-state amplitude, amplitude variation, phase difference, etc. can be used as metrics for comparison between the sensed high-frequency response signal and the high-frequency reference signal.

In some embodiments, the high-frequency excitation signal is a steady-state high-frequency signal. The steady-state high-frequency excitation signal can have a frequency of at least 100 kHz, 1 MHz, 10 MHz, 100 MHz, or greater. In other embodiments, the high-frequency excitation signal can be a short duration pulse containing high-frequency components. The metrics used in such a pulsed operation, for example, can include time difference between excitation time and response time, the presence of addition echo responses, pulse amplitudes of response pulse and/or echo responses, etc.

In some embodiments, electrical power cable 20 passes through passageways 42 and 48 of first and second transformers 28 and 30 one or more times. For example, electrical power cable 20 can be wrapped around first magnetic core 40 and/or second magnetic core 46 more than one times, thereby increasing the coupling between the primary and secondary windings of the first 28 and/or second 30 transformers.

Figure 3:
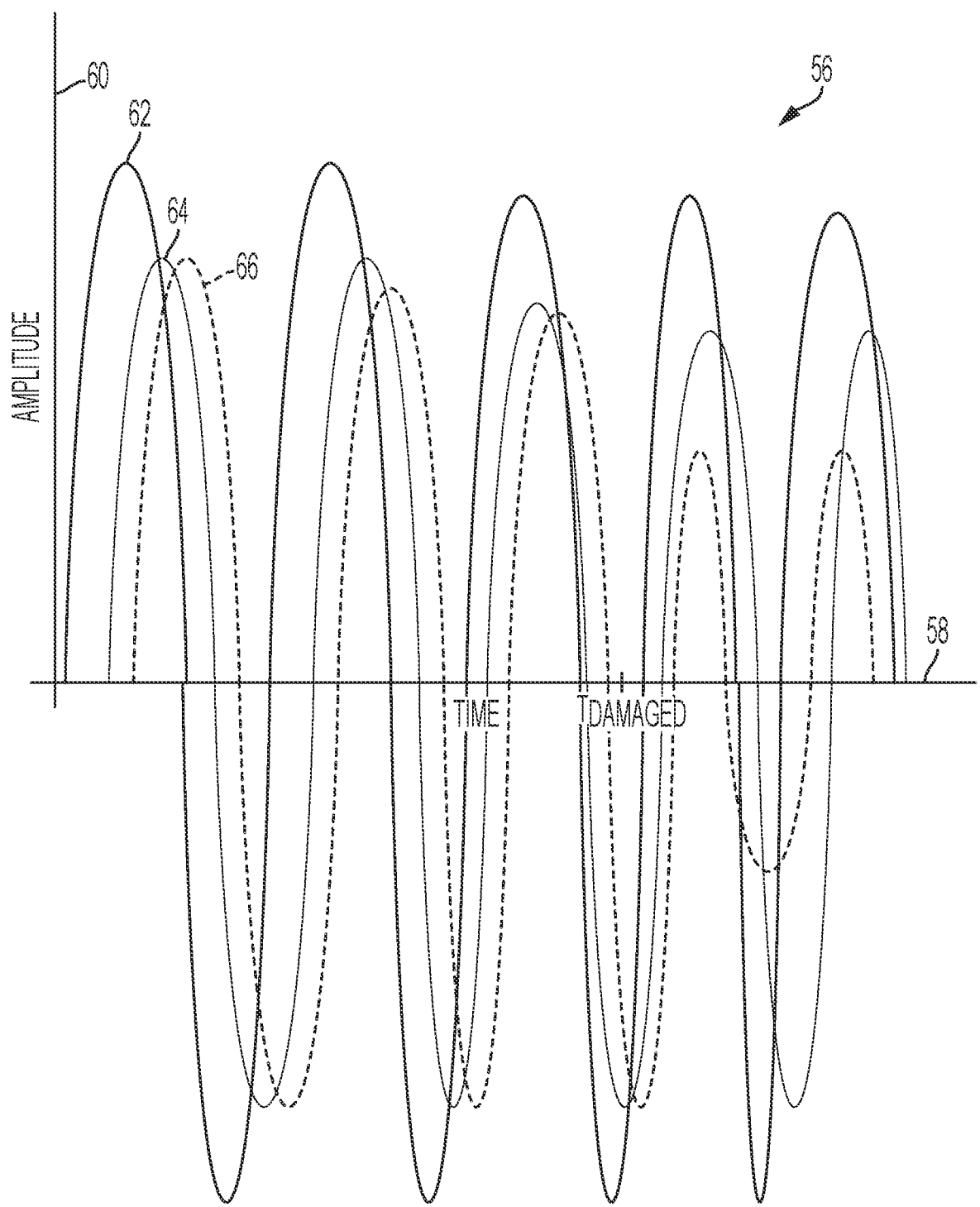
FIG. 3 are graphs exhibiting examples of a high-frequency excitation signal, a high-frequency response signal, and a high-frequency reference signal, respectively.

FIG. 3 are graphs exhibiting examples of a high-frequency excitation signal, a high-frequency response signal, and a high-frequency reference signal. In FIG. 3, graph 56 includes horizontal axis 58, vertical axis 60 and amplitude/time relations 62, 64, and 66. Horizontal axis 58 is indicative of time, and vertical axis 60 is indicative of signal amplitude. Amplitude/time relation 62 corresponds to an example of a high-frequency excitation signal, as generated by inducer 32 (as depicted in FIGS. 1-2) and induced, via first transformer 28, into electrical power cable 20 (at the first location where electrical power cable 20 passes through magnetic core 40 of first transformer 28).

Amplitude/time relation 64 corresponds to the high-frequency response signal generated, in response to the high-frequency excitation signal, at the second location of electrical power cable 20 (as depicted in FIGS. 1-2), where electrical power cable 20 passes through magnetic core 46 of second transformer 30. Initially, amplitude of amplitude/time relation 64 is at a first level $I_1$, and then at time $T_{DEGRADE}$, amplitude of amplitude/time relation 64 is attenuated to a lower level $I_2$. Such attenuation of the signal amplitude can be indicative of a sudden degradation of the powered electrical system. Although depicted as a sudden event, more commonly, degradation of the powered electrical system is of a slow long-term nature.

Amplitude/time relation 66 corresponds to an example of a high-frequency reference signal. Such a high-frequency reference signal can be a high-frequency response signal that is obtained at a time at which the powered electrical system is operating properly. Thus, such a high-frequency reference signal corresponds to the high-frequency response signal generated, in response to the high-frequency excitation signal, at the second location of electrical power cable 20 (as depicted in FIGS. 1-2), where electrical power cable 20 passes through magnetic core 46 of second transformer 30. In the depicted embodiment, the amplitude/time relation 66 has substantially the same phase and amplitude as amplitude/time relation 64 during the period of time before $T_{DEGRADE}$. But after time $T_{DEGRADE}$ both amplitude and phase of amplitude/time relation 66 differ from amplitude and phase of amplitude/time relation 64.

In some embodiments, controller 36 generates a signal indicative of leakage if a ratio of amplitudes of amplitude/time relation 64 and amplitude/time relation 66 is less than 0.9, 0.8, 0.5, 0.3, or less. In some embodiments, controller 36 generates a signal indicative of leakage if a difference in phases of amplitude/time relation 64 and amplitude/time relation 66 is greater than 15°, 30°, 45°, or 60°. Such a generated signal indicative of leakage can then be communicated to the pilot and/or a health monitoring system of aircraft 10, for example.

Discussion of Possible Embodiments

The following are non-exclusive descriptions of possible embodiments of the present invention.

Apparatus and associated methods relate to a system for measuring leakage current. The system includes first and second transformers, an inducer, a signal sensor and a controller. The first transformer has a primary winding about a first magnetic core having a first passageway configured to provide passage therethrough for an electrical cable. The second transformer has a secondary winding about a second magnetic core having a second passageway configured to provide passage therethrough for the electrical cable. The electrical cable operating as a secondary winding for the first transformer and a primary winding for the second transformer when passing through both the first and second passageways. The inducer conductively couples to the primary winding of the first transformer. The inducer generates a high-frequency excitation signal into the primary winding of the first transformer. The signal sensor is conductively coupled to the secondary winding of the second transformer. The signal sensor senses the high-frequency response signal induced, in response to the high-frequency excitation signal, into the secondary winding of the second transformer. The controller performs a signal comparison of a high-frequency reference signal and the high-frequency response signal sensed by the signal sensor. The controller generates a signal indicative of leakage based on the signal comparison.

The system of the preceding paragraph can optionally include, additionally and/or alternatively, any one or more of the following features, configurations and/or additional components:

A further embodiment of the foregoing system, wherein the electrical cable connecting the resistive heating element to the power source can include a plurality of conductors.

A further embodiment of any of the foregoing systems can further include the electrical cable.

A further embodiment of any of the foregoing systems, wherein the electrical cable can connect a power source to a resistive heating element.

A further embodiment of any of the foregoing systems, wherein the resistive heating element, when in good working condition, can be electrically isolated from a ground reference.

A further embodiment of any of the foregoing systems, wherein the first and second transformers can be spaced apart from one another.

A further embodiment of any of the foregoing systems, wherein the sensor can sense the high-frequency reference signal at a reference time.

A further embodiment of any of the foregoing systems, wherein the reference time can be a time of calibration.

A further embodiment of any of the foregoing systems, wherein the reference time can be a time of first operation.

Some embodiments relate to a method for measuring leakage current. The method includes coupling, via a first transformer having a primary winding about a first magnetic core having a first passageway configured to provide passage therethrough for an electrical cable, the electrical cable with the secondary winding of the electrical transformer. The method include coupling, via a second transformer having a secondary winding about a second magnetic core having a second passageway configured to provide passage therethrough for the electrical cable, the primary winding of the second transformer and the electrical cable. The method includes generating, via an inducer conductively coupled to the primary winding of the first transformer, a high-frequency excitation signal into the primary winding of the first transformer. The method includes sensing, via a sensor conductively coupled to the secondary winding of the second transformer, a high-frequency response signal induced into the secondary winding of the second transformer. The method includes performing, via a controller, a signal comparison of a high-frequency reference signal and the high-frequency response signal sensed by the sensor. The method also includes generating, via the controller, a signal indicative of leakage based on the signal comparison.

The method of the preceding paragraph can optionally include, additionally and/or alternatively, any one or more of the following features, configurations and/or additional components:

A further embodiment of the foregoing method, wherein the electrical cable connecting the resistive heating element to the power source can include a plurality of conductors.

A further embodiment of any of the foregoing methods can further include transmitting, via the electrical cable, the high-frequency electrical signal along a length of the electrical cable.

A further embodiment of any of the foregoing methods, wherein the electrical cable can connect a power source to a resistive heating element.

A further embodiment of any of the foregoing methods, wherein the resistive heating element, when in a degraded condition where leakage current results, can be conductively and/or capacitively coupled to a ground reference.

A further embodiment of any of the foregoing methods, wherein the first and second transformers can be spaced apart from one another.

A further embodiment of any of the foregoing methods, wherein the sensor can sense the high-frequency reference signal at a reference time.

A further embodiment of any of the foregoing methods, wherein the reference time can be a time of calibration.

A further embodiment of any of the foregoing methods, wherein the reference time can be a time of first operation.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A system for measuring leakage current, the system comprising:
   a first transformer having a primary winding about a first magnetic core having a first passageway providing passage therethrough for an electrical cable configured to provide operating power to a load, the electrical cable having a power conductor connected to a first terminal of the load and a return conductor connected to a second terminal of the load, the sum of electrical currents of the operating power conducted by the power conductor and return conductor being zero when no leakage current is present in the system;
   a second transformer having a secondary winding about a second magnetic core having a second passageway providing passage therethrough for the electrical cable;
   wherein both of the power conductor and return conductor of the electrical cable operate as a secondary winding for the first transformer and a primary winding for the second transformer when passing through both the first and second passageways;
   an inducer conductively coupled to the primary winding of the first transformer, the inducer generating a high-frequency excitation signal into the primary winding of the first transformer;
   a signal sensor conductively coupled to the secondary winding of the second transformer, the signal sensor sensing a high-frequency response signal induced, in response to the high-frequency excitation signal, into the secondary winding of the second transformer; and
   a controller that performs a signal comparison of two of a high-frequency reference signal and the high-frequency response signal sensed by the signal sensor, the controller generating a signal indicative of leakage based on the signal comparison, wherein the controller generates the signal indicative of leakage in response to a ratio of amplitudes of the high-frequency response signal and the high-frequency reference signal falling below 0.9.

2. The system of claim 1, wherein the electrical cable comprises a plurality of separate conductors.

3. The system of claim 1, wherein the load is a resistive heating element for an air data probe.

4. The system of claim 3, wherein the resistive heating element, when in good working condition, is electrically isolated from a ground reference.

5. The system of claim 3, wherein the resistive heating element, when in a degraded condition where leakage current results, is conductively and/or capacitively coupled to a ground reference.

6. The system of claim 1, wherein the first and second transformers are spaced apart from one another.

7. The system of claim 1, wherein the sensor senses the high-frequency reference signal at a reference time.

8. The system of claim 7, wherein the reference time is a time of calibration.

9. The system of claim 7, wherein the reference time is a time of first operation.

10. A method for measuring leakage current, the method comprising:
    coupling, via a first transformer having a primary winding about a first magnetic core having a first passageway providing passage therethrough for an electrical cable configured to provide operating power to a load, the electrical cable having a power conductor connected to a first terminal of the load and a return conductor connected to a second terminal of the load, the sum of electrical currents of the operating power conducted by the power conductor and return conductor being zero when no leakage current is present in the system, both of the power conductor and return conductor of the electrical cable operating as a secondary winding of the first transformer;
    coupling, via a second transformer having a secondary winding about a second magnetic core having a second passageway providing passage therethrough for the electrical cable, both of the power conductor and return conductor of the electrical cable operating as a primary winding of the second transformer;
    generating, via an inducer conductively coupled to the primary winding of the first transformer, a high-frequency excitation signal into the primary winding of the first transformer;
    sensing, via a sensor conductively coupled to the secondary winding of the second transformer, a high-frequency response signal induced into the secondary winding of the second transformer;
    performing, via a controller, a signal comparison of a high-frequency reference signal and the high-frequency response signal sensed by the sensor; and
    generating, via the controller, a signal indicative of leakage based on the signal comparison, wherein the controller generates the signal indicative of leakage in response to a ratio of amplitudes of the high-frequency response signal and the high-frequency reference signal falling below 0.9.

11. The method of claim 10, wherein the electrical cable comprises a plurality of separate conductors.

12. The method of claim 10, further comprising:
    transmitting, via the electrical cable, a high-frequency electrical signal along a length of the electrical cable.

13. The method of claim 10, wherein the load a resistive heating element for an air data probe.

14. The method of claim 13, wherein the resistive heating element, when in good working condition, is electrically isolated from a ground reference.

15. The method of claim 13, wherein the resistive heating element, when in a degraded condition where leakage current results, is conductively and/or capacitively coupled to a ground reference.

16. The method of claim 10, wherein the first and second transformers are spaced apart from one another.

17. The method of claim 10, wherein the sensor senses the high-frequency reference signal at a reference time.

18. The method of claim 17, wherein the reference time is a time of calibration.

19. The method of claim 17, wherein the reference time is a time of first operation.

* * * * *